(12) United States Patent
Baniecki et al.

(10) Patent No.: US 7,349,195 B2
(45) Date of Patent: Mar. 25, 2008

(54) THIN FILM CAPACITOR AND METHOD FOR MANUFACTURING THE SAME

(75) Inventors: John David Baniecki, Kawasaki (JP); Takeshi Shioga, Kawasaki (JP); Kazuaki Kurhara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/580,872

(22) Filed: Oct. 16, 2006

(65) Prior Publication Data
US 2007/0031590 A1    Feb. 8, 2007

Related U.S. Application Data

(62) Division of application No. 10/940,605, filed on Sep. 15, 2004, which is a division of application No. 10/365,478, filed on Feb. 13, 2003, now Pat. No. 6,882,516.

(30) Foreign Application Priority Data

Mar. 25, 2002    (JP)    ................ 2002-83315

(51) Int. Cl.
 *H01G 4/06*    (2006.01)
(52) U.S. Cl. ................ 361/321.2; 361/321.1; 361/311; 361/313; 361/306.1; 361/306.3; 257/295; 257/296
(58) Field of Classification Search ............ 361/321.2, 361/321.1, 321.4, 311–313, 306.1, 306.3, 361/302–305; 257/306–309, 295, 296
See application file for complete search history.

(56) References Cited

U.S. PATENT DOCUMENTS

| | | | |
|---|---|---|---|
| 5,563,762 A * | 10/1996 | Leung et al. ............ 361/301.4 |
| 5,717,233 A | 2/1998 | Fujii et al. | |
| 5,739,563 A | 4/1998 | Kawakubo et al. | |
| 5,978,207 A | 11/1999 | Anderson et al. | |
| 5,986,301 A | 11/1999 | Fukushima et al. | |
| 6,143,597 A * | 11/2000 | Matsuda et al. ............ 438/240 |
| 6,190,924 B1 | 2/2001 | Lee | |
| 6,208,500 B1 * | 3/2001 | Alexander et al. .......... 361/303 |

(Continued)

FOREIGN PATENT DOCUMENTS

JP        5-343254        12/1993

(Continued)

OTHER PUBLICATIONS

Japanese Office Action dated Oct. 3, 2006 issued in corresponding to Application No. JP2002-083315.

*Primary Examiner*—Nguyen T. Ha
(74) *Attorney, Agent, or Firm*—Westerman, Hattori, Daniels & Adrian, LLP.

(57) ABSTRACT

The present invention provides the steps of (a) forming a first electrode on a substrate via an adhesion enhancing layer, (b) forming a capacitor insulating film containing a laminated film, in which an amorphous dielectric film and a polycrystalline dielectric film are laminated via a wave-like interface, by forming sequentially and successively the amorphous dielectric film and the polycrystalline dielectric film made of same material on the first electrode, (c) forming a second electrode on the capacitor insulating film, and (d) a step of annealing the capacitor insulating film in an oxygen atmosphere.

4 Claims, 6 Drawing Sheets

U.S. PATENT DOCUMENTS

| | | |
|---|---|---|
| 6,307,731 B1 * | 10/2001 | Katori ........................ 361/305 |
| 6,323,057 B1 | 11/2001 | Sone |
| 6,335,551 B2 | 1/2002 | Takemura |
| 6,381,119 B1 | 4/2002 | Kattori |
| 6,507,476 B1 | 1/2003 | Shaw et al. |
| 6,700,771 B2 * | 3/2004 | Bhattacharyya ............. 361/311 |
| 6,882,516 B2 | 4/2005 | Baniecki et al. |
| 7,113,388 B2 * | 9/2006 | Mussig .................... 361/306.2 |

FOREIGN PATENT DOCUMENTS

| | | |
|---|---|---|
| JP | 9-36309 | 2/1997 |
| JP | 10-242393 A | 9/1998 |
| JP | 11-330391 | 11/1999 |
| JP | 2000-31403 | 1/2000 |

* cited by examiner

THIN FILM CAPACITOR AND METHOD FOR MANUFACTURING THE SAME

CROSS-REFERENCE TO RELATED APPLICATIONS

This application is based upon and claims priority of Japanese Patent Application No. 2002-83315, filed on Mar. 25, 2002, the contents being incorporated herein by reference. This is a division of Ser. No. 10/940,605 filed on Sep. 15, 2004, which is a division of Ser. No. 10/365,478 filed on Feb. 13, 2003, U.S. Pat. No. 6,882,516.

BACKGROUND OF THE INVENTION

1. Field of the Invention

The present invention relates to a thin film capacitor and a method of manufacturing the same and, more particularly, a thin film capacitor having a high-dielectric capacitor insulating film and a method of manufacturing the same.

2. Description of the Prior Art

The integrated high-dielectric thin film capacitor is employed as the decoupling capacitor that suppresses voltage noises or voltage variation caused in the power bus line, the storage capacitor of DRAM or nonvolatile FRAM (NV-FRAM), and the dynamic tunable element in applications of the microwave devices. In these applications, high-dielectric material or ferroelectric material made of any one of the oxide having the perovskite structure such as $(Ba,Sr)TiO_3$ and the compound containing the pyrochlore structure such as $Pb2(ZrTi)_2O_7$ is often employed as the material of the capacitor insulating film.

However, major reasons for hesitating the employment of these capacitor insulating films are that the leakage current is large and reliability is low at the time of high voltage application.

The electrical characteristics of the capacitor are strongly affected by film quality of the dielectric film as the capacitor insulating film, particularly the dielectric oxide thin film. In more detail, normally the polycrystalline dielectric oxide thin film has a high relative dielectric constant but has a low breakdown voltage. In contrast, the amorphous dielectric oxide thin film has a low relative dielectric constant but has a high breakdown voltage and a small leakage current. Thus, such thin film can attain the high reliability.

Based on these considerations, in order to compensate the polycrystalline dielectric oxide thin film and the amorphous dielectric oxide thin film for respective demerits, it may be thought of to employ a laminated structure containing both of them. An example of such laminated structure is shown in FIG. 1 as a sectional view. In FIG. 1, 1 is a silicon substrate, 2 is a silicon oxide film, 3 is a first electrode, 4 is an amorphous dielectric oxide thin film, 5 is a polycrystalline dielectric oxide thin film, and 6 is a second electrode.

Such laminated structure can lead to an optimization of the electrical characteristics such as the capacitance, the leakage current, the breakdown voltage, etc. In other words, it can lead to a formation of the capacitor with the high breakdown voltage, the small leakage current, and the available capacitance value.

Such laminating method/laminated structure are set forth in U.S. Pat. Nos. 6,190,924B1 and 6,143,597, and Japanese Patent Application Publications (KOKAI) Hei 05-343254, Hei 09-36309, Hei 11-330391, 2003-31403, etc. According to these prior arts, the laminated structure is obtained by laminating the flat amorphous dielectric thin film and the flat polycrystalline dielectric thin film. The flat amorphous dielectric oxide thin film and the flat polycrystalline dielectric oxide thin film are formed of different film forming material under different film forming conditions respectively.

However, according to this laminating method, since the sufficiently high effective dielectric constant cannot be derived yet and also a variety of film forming conditions and film forming materials are required, it causes a serious problem such that complexity of the production control is increased and thus increase in a production cost is brought about. Also, since the film forming conditions and the film forming materials are different, respective film formations must be carried out while changing the chamber and thus it is possible that the interface between the amorphous dielectric thin film and the polycrystalline dielectric thin film is contaminated.

SUMMARY OF THE INVENTION

It is an object of the present invention to provide a thin film capacitor capable of achieving a larger relative dielectric constant, a higher breakdown voltage, and a smaller leakage current while simplifying film forming conditions and film forming material to have high reliability, and a method of manufacturing the same.

A thin film capacitor of this application, comprises a first electrode formed on a substrate; a capacitor insulating film containing a laminated film, which is constructed by laminating an amorphous dielectric film and a polycrystalline dielectric film via a wave-like interface, on the first electrode; and a second electrode formed on the capacitor insulating film.

According to the thin film capacitor of the present invention, the capacitor insulating film is constructed by laminating the amorphous dielectric film and the polycrystalline dielectric film via the wave-like interface. Therefore, the breakdown voltage is decided by the large film thickness portion of the amorphous dielectric film, and also a magnitude of the leakage current is decided by the small film thickness portion of the amorphous dielectric film. Also, the capacitance is decided in proportion to an effective film thickness of the polycrystalline dielectric film, which is an average film thickness thereof if the wave-like interface would have been flattened on an average.

Meanwhile, in the laminated structure in the prior art, if the film thickness of the amorphous dielectric film is decided so that the laminated structure in the prior art has the same breakdown voltage as the laminated structure of the present invention, the film thickness of the polycrystalline dielectric film is reduced much more in the laminated structure having the flat interface, and thus the effective relative dielectric constant is lowered.

In this manner, the capacitor of the present invention having the laminated structure via the wave-like interface can enhance the relative dielectric constant and can achieve the improvement of the breakdown voltage, and also can maintain the small leakage current.

According to the experiment made by the inventors of the present invention, if the laminated structure of the present invention having the wave-like interface and the laminated structure having the flat interface in the prior art are compared with each other under such a condition that a maximum film thickness of the amorphous dielectric film having the wave-like surface is set equal to the film thickness of the amorphous dielectric film having the flat surface, the capacitor of the present invention having the laminated structure via the wave-like interface was able to enhance the effective relative dielectric constant and was able to achieve the improvement of the breakdown voltage and also reduction in the leakage current.

In a thin film capacitor of this application, an adhesion enhancing layer is formed between the substrate and the first electrode, and the adhesion enhancing layer consists of a film made of noble metal or its alloy, alloy of noble metal and base metal, noble metal oxide, metal oxide, metal nitride, or mixture containing any two or more of the noble metal, the alloy, the oxide and the nitride, or a multi-layered film containing any two films or more made of the noble metal, the alloy, the oxide or the nitride.

According to the thin film capacitor of the present invention, the adhesion enhancing layer for increasing a mutual adhesion strength is formed between the substrate and the first electrode. Therefore, peeling-off of the capacitor from the substrate can be prevented, and also reliability of the device into which the thin film capacitor is installed can be improved.

A method of manufacturing a thin film capacitor set forth in this application, comprises the steps of (a) forming a first electrode on a substrate via an adhesion enhancing layer; (b) forming a capacitor insulating film containing a laminated film, in which an amorphous dielectric film and a polycrystalline dielectric film are laminated via a wave-like interface, by forming sequentially and successively the amorphous dielectric film and the polycrystalline dielectric film made of same material on the first electrode; (c) forming a second electrode on the capacitor insulating film; and (d) annealing the capacitor insulating film in an oxygen atmosphere.

According to the present invention, the amorphous dielectric film and the polycrystalline dielectric film are formed successively by using the same material under the same film forming conditions. The inventors of the present invention have verified experimentally the fact that the laminated structure having the wave-like interface can be formed according to such film formation. In the above film forming method, the growth mechanism to be described in the following may be considered. That is, the growth is started at the temperature at which the amorphous dielectric film can be grown. Then, cores of crystals are generated with the increase in temperature of the growth surface caused by the collision of the film forming material against the growth surface. Then, crystal grains are grown up from these cores to form the polycrystalline dielectric film. In this case, since the growth of the crystal grains spreads from the cores of crystals to peripheries, the interface between the amorphous dielectric film and the polycrystalline dielectric film is formed like the wave.

Therefore, since the laminated structure constructed by laminating the amorphous dielectric film and the polycrystalline dielectric film can be formed in the same chamber, contamination of the layer interface in the laminated structure can be prevented. Also, since the same film forming conditions and the same film forming material can be employed, the production control can be simplified and also reduction in the production cost can be achieved.

In the method of manufacturing the thin film capacitor set forth in this application, in the step (b), the amorphous dielectric film and the polycrystalline dielectric film are formed successively while heating the substrate at a constant temperature of less than 450° C.

According to the present invention, since the amorphous dielectric film and the polycrystalline dielectric film are formed successively at a constant temperature of less than 450° C., the amorphous dielectric film can be grown to have an appropriate film thickness. Therefore, as shown in FIG. 3, the result leads to a formation of the laminated structure consisting of the amorphous dielectric film and the polycrystalline dielectric film and having the wave-like interface between them.

In the method of manufacturing the thin film capacitor set forth in this application, in the step (b), formation of the laminated film is executed by an RF magnetron sputter method or a DC sputter method.

The present invention employs the RF magnetron sputter method or the DC sputter method, and thus it is capable of forming the laminated structure consisting of the amorphous dielectric film and the polycrystalline dielectric film and having the wave-like interface between them, as shown in FIG. 3, by the continuous film formation using the same film forming material under the same film forming conditions.

In the method of manufacturing the thin film capacitor set forth in this application, in the RF magnetron sputter method or the DC sputter method in the step (b), the amorphous dielectric film and the polycrystalline dielectric film are formed successively while keeping at least a pressure of the sputter gas, a flow rate of the sputter gas, and power application conditions to the sputter gas constant.

According to the experiment made by the inventors of the present invention, in the RF magnetron sputter method or the DC sputter method, if at least the pressure of the sputter gas, the flow rate of the sputter gas, and the power application condition of the sputter gas are kept constant, it can lead to a formation of the laminated structure in which the amorphous dielectric film and the polycrystalline dielectric film are laminated via the wave-like interface.

DESCRIPTION OF THE PREFERRED EMBODIMENTS

Embodiments of the present invention will be explained with reference to the drawings hereinafter.

First Embodiment

Figure 1:
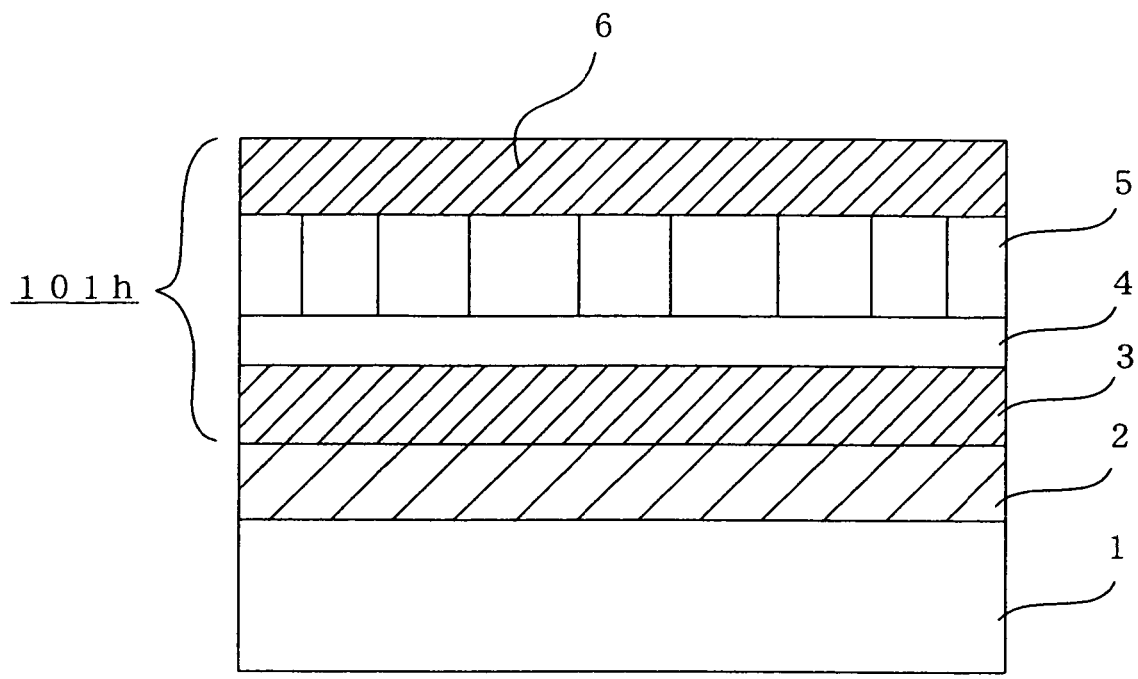
FIG. 1 is a sectional view showing a structure of an overall capacitor in the prior art.
Figure 2:
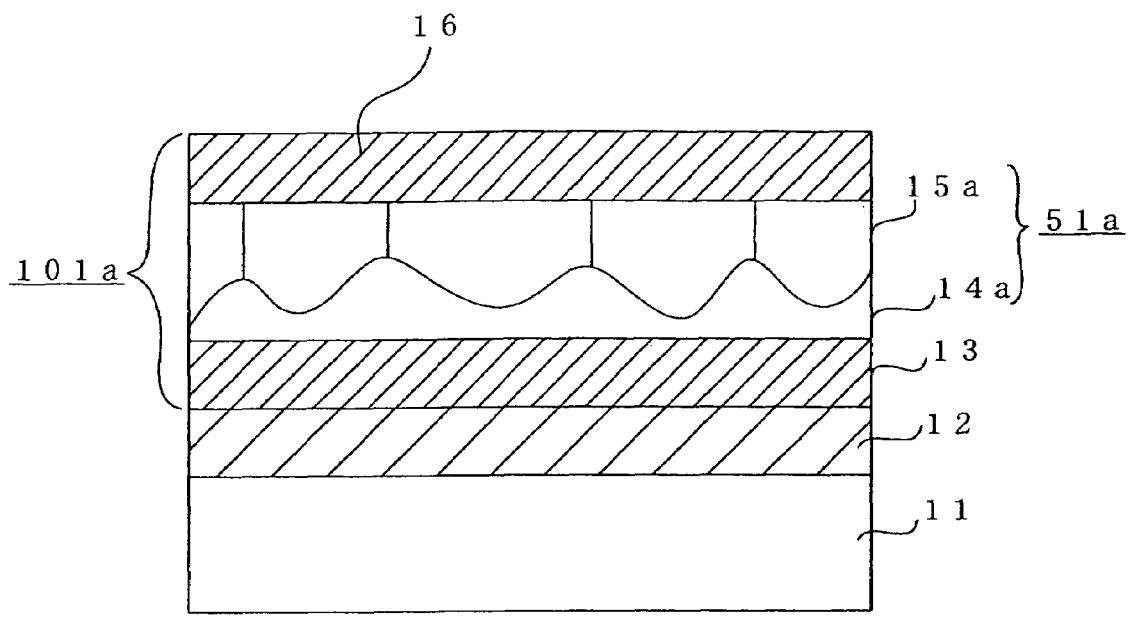
FIG. 2 is a sectional view showing a structure of an overall capacitor in a first example according to a first embodiment of the present invention.
Figure 3:
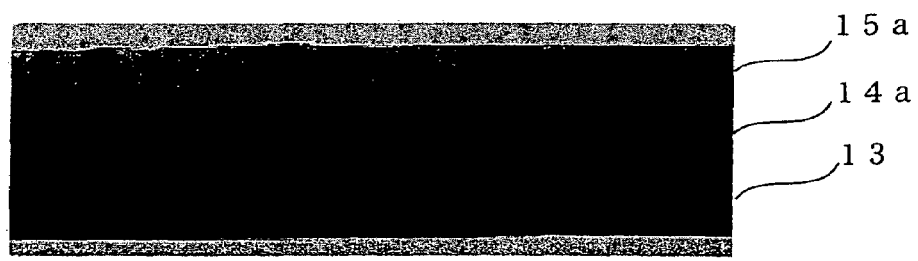
FIG. 3 is a microphotograph showing a cross section of a capacitor insulating film in FIG. 2.
Figure 5:
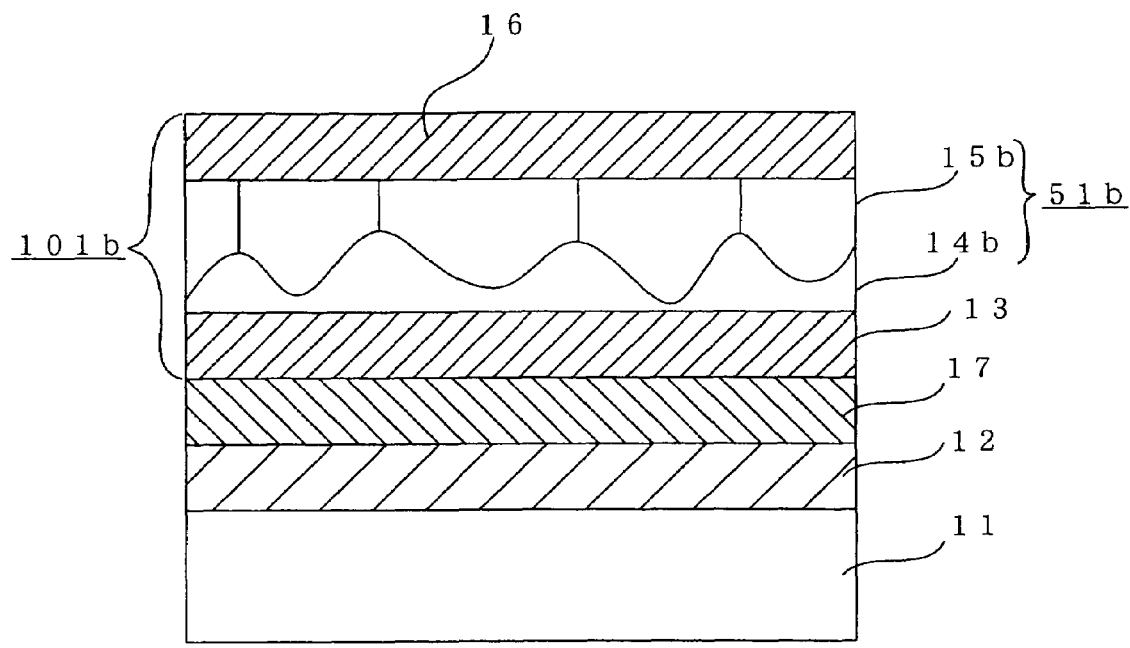
FIG. 5 is a sectional view showing a structure of an overall capacitor in a second example according to the first embodiment of the present invention.
Figure 6:
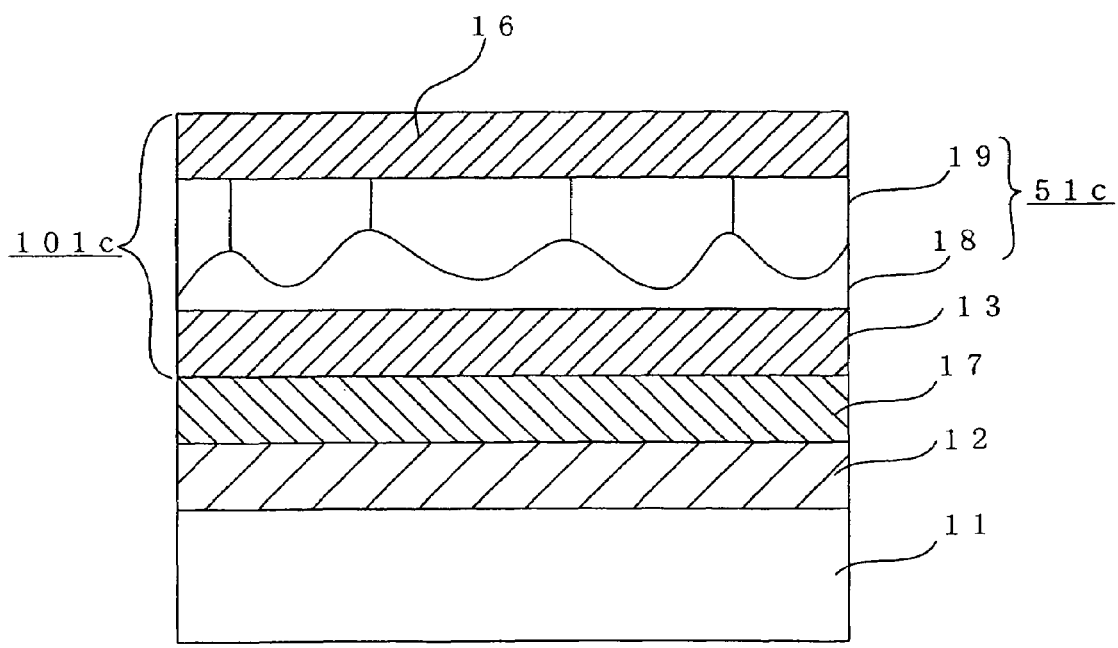
FIG. 6 is a sectional view showing a structure of an overall capacitor in a third example according to the first embodiment of the present invention.

FIG. 2, FIG. 5 and FIG. 6 are sectional views showing a structure of a capacitor having a high-dielectric capacitor insulating film as a first embodiment of the present invention. FIG. 3 is a microphotograph showing a cross section of the formed capacitor insulating film.

As shown in FIG. 2, FIG. 5, or FIG. 6, the capacitor in this embodiment has a semiconductor substrate 11, an insulating film 12 formed thereon, a first electrode 13 formed on the insulating film 12, a capacitor insulating film 51a, 51b, or 51c formed on the first electrode 13, and a second electrode 16 formed on the capacitor insulating film 51a, 51b, or 51c.

In the capacitor insulating film 51a, 51b, 51c, amorphous dielectric insulating films 14a, 14b, 18 and polycrystalline dielectric insulating films 15a, 15b, 19 are laminated via a wave-like interface. In above Figures, crystal grains are shown by regions that are fractionated by vertical lines in the polycrystalline dielectric insulating films 15a, 15b, 19. Each of crystal grains has a different crystal axis, respectively. In the capacitor insulating films 51a, 51b, 51c, a minimum film thickness value of the amorphous dielectric insulating films 14a, 14b, 18 is in a range of 1 nm to 100 nm and a maximum film thickness value thereof is in a range of 3 nm to 300 nm.

As shown in FIG. 5 and FIG. 6, normally an adhesion enhancing layer 17 is interposed between the insulating film 12 and the first electrode 13 to enhance a mutual adhesion.

The semiconductor substrate 11 consists of a silicon (Si) substrate, a germanium (Ge) substrate, a silicon germanium (SiGe) substrate, or a group III-V compound semiconductor substrate.

Also, the insulating film 12 on the semiconductor substrate 11 consists of an oxide film, a nitride film, an oxide nitride film, a high-dielectric metal oxide film, a xerogel film made of silica or the like, an insulating film made of mixture containing any two or more of oxide, nitride, oxide nitride, high-dielectric metal oxide and xerogel, or a multi-layered film containing any two or more of these films.

The adhesion enhancing layer 17 consists of a film made of noble metal or its alloy, alloy of noble metal and base metal, noble metal oxide, metal oxide, metal nitride, or mixture containing any two or more of the noble metal, the alloy, the oxide and the nitride, or a multi-layered film containing any two or more of films made of the above metal, the alloy, the oxide or the nitride. More particularly, Pt, Ir, Zr, Ti, $TiO_x$, $IrO_x$, $PtO_x$, $ZrO_x$, TiN, TiAlN, TaN, TaSiN, or the like may be employed as the material of the adhesion enhancing layer 17.

The first electrode 13 consists of a conductive film that is made of transition metal, noble metal or its alloy, alloy of noble metal and base metal, conductive oxide, or mixture containing any two or more of these metals, the alloys and the oxide, or a multi-layered conductive film that contains any two films or more made of these metals, the alloys or the oxide. More particularly, a metal such as Pt, Pd, Ir, Ru, Rh, Re, Os, Au, Ag, Cu, etc. and a conductive oxide such as $PtO_x$, $IrO_x$, $RuO_x$, etc. may be employed as the material of the first electrode 13.

As the dielectric material of both or any one of the amorphous dielectric films 14a, 14b, 18 and the polycrystalline dielectric insulating films 15a, 15b, 19 of the capacitor insulating films 51a, 51b, 51c, the perovskite-type oxide having a structural formula $ABO_3$ (where A is at least one positive ion having 1 to 3 positive charges, and B is acidic oxide that contains a metal belonging to a group IVB, group VB, group VIB, group VIIB, or group IB in the periodic table) can be employed. More particularly, there are (Ba,Sr)$TiO_3$, $PbTiO_3$, etc. as such perovskite-type oxide.

Otherwise, as the dielectric material of both or any one of the amorphous dielectric films 14a, 14b, 18 and the polycrystalline dielectric insulating films 15a, 15b, 19, the compound containing the pyrochlore structure having a structural formula $A_2B_2O_x$ (where A is at least one positive ion having 1 to 3 positive charges, B is acidic oxide that contains a metal belonging to a group IVB, group VB, group VIB, group VIIB, or group IB in the periodic table, and x is 6 to 7) may be employed. There is Ti, Zr, Hf, or the like as the group IVB metal in the periodic table, there is V, Nb, or Ta as the group VB metal, there is Cr, Mo, W, or the like as the group VIB metal, there is Mn, Re, or the like as the group VIIB metal, and there is Cu, Ag, Au, or the like as the group IB metal. Also, particularly there is $Pb_2(ZrTi)_2O_7$, or the like as the compound containing such pyrochlore structure.

Further, both or any one of the amorphous dielectric films 14a, 14b, 18 and the polycrystalline dielectric films 15a, 15b, 19 of the capacitor insulating films 51a, 51b, 51c may be formed of a film that consists of any one of dielectric materials of titanate, aluminate, niobate, and tantalate, or a multi-layered film that contains any two or more of the films made of these dielectric materials.

Otherwise, both or any one of the amorphous dielectric films 14a, 14b, 18 and the polycrystalline dielectric films 15a, 15b, 19 of the capacitor insulating films 51a, 51b, 51c may be formed of a film that contains any one of dielectric materials of barium titanate, strontium titanate, barium strontium titanate, tantalum oxide, potassium tantalum oxide, lanthanum aluminate, yttrium aluminate, bismuth titanate, strontium bismuth tantalum oxide, strontium bismuth niobate, strontium bismuth tantalate niobate, tin zirconate titanate, tin tantalum zirconate titanate, and tin magnesium niobate, or a film that is made of a mixture which contains two or more of these dielectric materials and into which a dopant is introduced. As the dopant, Mn, Ni, Fe, or Y is employed.

The second electrode 16 consists of a conductive film that is made of transition metal, noble metal or its alloy, alloy of noble metal and base metal, conductive oxide, or mixture containing any two or more of these metals, the alloys and the oxide, or a multi-layered conductive film that contains at least a double-layer or more film made of these metals, the alloys or the oxide. More particularly, a metal such as Pt, Pd, Ir, Ru, Rh, Re, Os, Au, Ag, Cu, etc. and a conductive oxide such as $PtO_x$, $IrO_x$, $RuO_x$, $SrRuO_3$, $LaNiO_3$, etc. may be employed as the material of the second electrode 16.

In this case, although not shown, a passivation film is formed on the second electrode 16 in some case.

According to the thin film capacitor of the first embodiment of the present invention, since the capacitor insulating film is constructed by laminating the amorphous dielectric film 14a, 14b, or 18 and the polycrystalline dielectric film 15a, 15b, or 19 via the wave-like interface, the breakdown voltage is decided by the large film thickness portion of the amorphous dielectric film 14a, 14b, or 18 and also a magnitude of the leakage current is decided by the small film thickness portion thereof. Also, the capacitance is decided in proportion to an effective film thickness of the polycrystalline dielectric film 15a, 15b, or 19, which is an average film thickness thereof if the wave-like interface would have been flattened on an average.

Meanwhile, in the laminated structure having a flat interface, if the film thickness of the amorphous dielectric film is decided so that the laminated structure in the prior art has the same breakdown voltage as the laminated structure of the present invention, the film thickness of the polycrystalline dielectric film is reduced much more in the laminated structure having the flat interface, and thus the relative dielectric constant is lowered in the laminated structure in the prior art.

In this manner, the capacitor of the present invention having the laminated structure via the wave-like interface can enhance the effective relative dielectric constant and achieve the improvement of the breakdown voltage, and also can maintain the small leakage current.

Next, a method of manufacturing the above capacitor will be explained with reference to FIG. 2, FIG. 5, and FIG. 6 hereunder.

First, the insulating film 12 is formed on the semiconductor substrate 11. If the silicon substrate is employed as the semiconductor substrate, a silicon oxide film is formed by thermally oxidizing a surface of the silicon substrate. In this case, after this formation and before the first electrode 13 is formed, the adhesion enhancing layer 17 may be formed to enhance the adhesion between the insulating film 12 and the first electrode 13.

Then, the first electrode 13 is formed on the insulating film 12 and the adhesion enhancing layer 17 by the magnetron sputter method.

Then, the amorphous dielectric film 14a, 14b, or 18 and the polycrystalline dielectric film 15a, 15b, or 19 are formed sequentially and successively on the first electrode 13 by using the dielectric material. Thus, it results in a formation of the capacitor insulating film 51a, 51b, or 51c containing the laminated films, which is composed of the amorphous dielectric film 14a, 14b, or 18 and the polycrystalline dielectric film 15a, 15b, or 19 laminated via the wave-like interface.

This film forming step is executed at a predetermined substrate heating temperature of less than 450° C. Also, the RF magnetron sputter method or the DC sputter method may be employed. In these sputter methods, while keeping at least the pressure of the sputter gas, the flow rate of the sputter gas, and the power application condition of the sputter gas constant, the amorphous dielectric film 14a, 14b, or 18 and the polycrystalline dielectric film 15a, 15b, or 19 are formed successively.

As the reason why the wave-like interface is formed between the amorphous dielectric film 14a, 14b, or 18 and the polycrystalline dielectric film 15a, 15b, or 19 respectively, a following mechanism can be considered. That is, at first the amorphous dielectric film 14a, 14b, or 18 is formed by starting the growth at a low temperature at which the amorphous dielectric film 14a, 14b, or 18 can be grown. Then, cores of crystals are generated with the increase in temperature of the growth surface caused by the collision of the film forming material against the growth surface. Then, crystal grains are grown up from these cores to form the polycrystalline dielectric film 15a, 15b, or 19. In this case, since the growth of the crystal grains spreads gradually from the cores of crystals to peripheries, the interface between the amorphous dielectric film 14a, 14b, or 18 and the polycrystalline dielectric film 15a, 15b, or 19 is formed like the wave.

Also, since the substrate heating temperature is set to a constant temperature of less than 450° C., the amorphous dielectric film 14a, 14b, or 18 can be grown to have an appropriate film thickness. The initial growth temperature is decided by the substrate heating temperature, and a film thickness of the amorphous dielectric film 14a, 14b, or 18 is formed thicker as this temperature is set lower.

Then, the second electrode 16 is formed on the capacitor insulating film 51a, 51b, or 51c.

Then, in order to recover the oxygen defect that is caused in the polycrystalline dielectric film 15a, 15b, or 19 by the sputter particles when the second electrode 16 is formed, the capacitor insulating film 51a, 51b, or 51c is annealed in a temperature range of 300 to 600° C. for 15 to 30 minute in the oxygen atmosphere. A lower limit of 300° C. in the annealing temperature is set as a lower limit temperature that can achieve effectively the recovery of the oxygen defect. An upper limit of 600° C. is set because there is such a possibility that the amorphous film is converted into the polycrystalline film if the annealing temperature exceeds such upper limit.

In this case, the final annealing process can be omitted as the case may be. The annealing process can be omitted in the case where the capacitor of the present invention is employed for the application in which the voltage is applied while setting the polycrystalline side to a positive potential and setting the amorphous side to a negative potential. In this case, the electrons move from the amorphous side to the polycrystalline side. Hence, it is the interface between the amorphous dielectric film 14a, 14b, or 18 and the underlying first electrode 13 that dominates the leakage current. The barrier of this interface is very high since one side of the interface is formed of the amorphous substance, so that the sufficiently good leakage characteristic can be essentially obtained. As a result, the annealing process to be executed after the film formation can be omitted. On the contrary, if the capacitor of the present invention is applied to the storage capacitor of DRAM, the polycrystalline side is set to the positive potential as well as the negative potential and also the amorphous side is set to the negative potential as well as the positive potential. In this case, since the interface between the polycrystalline dielectric film 15a, 15b, or 19 and the overlaying second electrode 16 dominates the leakage current, crystallinity of the polycrystalline dielectric film 15a, 15b, or 19 becomes an important matter. As a result, the annealing process cannot be omitted.

With the above, a capacitor 101a, 101b, or 101c is completed. Then, a passivation film for covering the capacitor 101a, 101b, or 101c may be formed if necessary.

As described above, according to the method of manufacturing the thin film capacitor in the first embodiment of the present invention, the amorphous dielectric film 14a, 14b, or 18 and the polycrystalline dielectric film 15a, 15b, or 19 are formed successively by using the same material under the same film forming conditions.

Therefore, the laminated structure in which the amorphous dielectric film and the polycrystalline dielectric film are laminated via the wave-like interface can be formed. In this case, contamination of the layer interface in the laminated structure can be prevented since these films are formed successively in the same chamber, and also simplification of the production control and reduction in the production cost can be achieved since the same film forming conditions and the same film forming material can be employed.

First Example

Next, a structure of the capacitor 101a as a first example of the present invention will be explained with reference to FIG. 2 and FIG. 3 hereunder.

FIG. 2 is a view showing a sectional structure of the capacitor 101a as the first example of the present invention. FIG. 3 is a microphotograph showing a cross section of the capacitor insulating film that is examined through a microscope.

As shown in FIG. 2, the capacitor 101a was formed on the silicon oxide film 12 overlaying the silicon substrate 11.

As the dielectric material of the capacitor insulating film 51a, barium strontium titanium oxide (abbreviated to "BSTO" hereinafter) was employed. As the method of forming the capacitor insulating film 51a, the RF magnetron sputter method was employed. As the film forming conditions, the substrate heating temperature was set constant as 250° C., the RF power was set to 100 W, the $Ar/O_2$ ratio was adjusted to 30/3.7 by adding $O_2$ to Ar as the sputter gas, and the gas pressure was set to 10 mTorr.

As shown in FIG. 3, it was found that, in the formed laminated structure, the amorphous dielectric film 14a and the polycrystalline dielectric film 15a are laminated via the wave-like interface. A total film thickness was about 100 nm. In such thickness, a minimum film thickness of the amorphous dielectric film 14a was almost 10 nm and a maximum film thickness thereof was almost 30 nm. Also, according to another examination, a Sr containing rate (23%) of the amorphous dielectric film 14a was slightly smaller than that (26%) of the polycrystalline dielectric film 15a.

Then, the relative dielectric constant $\epsilon$, the capacitance C ($\mu F/cm^2$) per unit area, the leakage current density $J_L$ ($A/cm^2$), and the dielectric breakdown field strength $E_{br}$ (V/cm) of the above capacitor 101a were measured respectively.

The relative dielectric constant $\epsilon$ was about 50, the capacitance C per unit area was about 0.44 $\mu F/cm^2$, and the dielectric breakdown field strength $E_{br}$ was in excess of 3 MV/cm.

Figure 4:
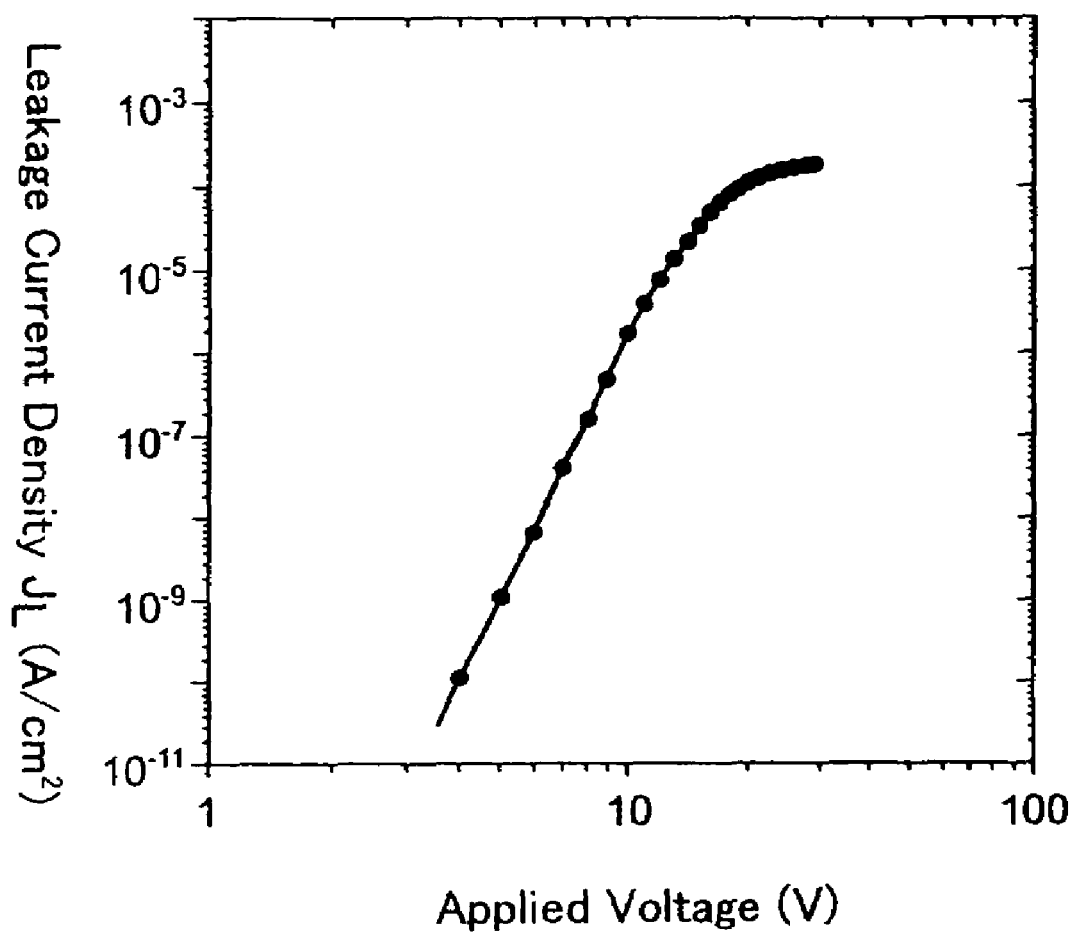
FIG. 4 is a graph showing measured results of a leakage current density of the capacitor in FIG. 2.

Also, FIG. 4 is a graph showing measured results of the leakage current density with respect to the applied voltage. In FIG. 4, an ordinate denotes the leakage current density $J_L$ ($A/cm^2$) in a logarithmic scale, and an abscissa denotes the applied voltage (V) in a linear scale. According to the measured results, the leakage current density $J_L$ was about $10^{-10}$ $A/cm^2$ at the applied voltage of 4 V, and thus the very small value of $J_L$ was obtained.

Second Example

Next, a structure of the capacitor 101b as a second example of the present invention will be explained with reference to FIG. 5 hereunder. FIG. 5 is a view showing a sectional structure of the capacitor 101b as the second example of the present invention.

A difference from the first example is that the adhesion enhancing layer 17 was formed between the silicon oxide film 12 on the silicon substrate 11 and the first electrode 13. As the material of the adhesion enhancing layer 17, a $TiO_2$ film was employed. Then, a further difference from the first example is that a film thickness of the amorphous dielectric film 14b of the capacitor insulating film 51b was formed thin. A minimum film thickness of the amorphous dielectric film 14b was almost 1 nm, and a maximum film thickness thereof was almost 10 nm. The reason why the film thickness of the amorphous dielectric film 14b was formed thin is that, since the substrate heating temperature during the film formation was set higher than the first example such as 300° C., the temperature of the film forming surface was increased from the amorphous growth temperature to the polycrystalline growth temperature at its early stage of the film formation.

A film thickness of the overall capacitor insulating film 51b is set to the same thickness as the first example and was about 100 nm.

Then, the relative dielectric constant $\epsilon$, the capacitance C ($\mu F/cm^2$) per unit area, the leakage current density $J_L$ ($A/cm^2$), and the dielectric breakdown field strength $E_{br}$ (V/cm) of the capacitor 101b formed as above were measured respectively.

The relative dielectric constant $\epsilon$ was about 80, the capacitance C per unit area was about 0.71 $\mu F/cm^2$, and the dielectric breakdown field strength $E_{br}$ was more than 2 MV/cm. Also, the leakage current density $J_L$ was about $10^{-9}$ $A/cm^2$ at the applied voltage of 4 V. Since the film thickness of the amorphous dielectric film 14b of the capacitor insulating film 51b was formed thin rather than the first example, the dielectric breakdown field strength $E_{br}$ was lowered and also the leakage current density $J_L$ was increased slightly, nevertheless both characteristics were kept at a very good level rather than the laminated structure that has the flat interface in the prior art.

Third Example

Next, a structure of the capacitor 101c as a third example of the present invention will be explained with reference to FIG. 6 hereunder. FIG. 6 is a view showing a sectional structure of the capacitor 101c as the third example.

Differences from the first example reside in that strontium titanium oxide (STO) was employed as the dielectric material of the capacitor insulating film 51c and the laminated structure in which the amorphous STO film 18 and the polycrystalline STO film 19 were laminated via the wave-like interface was employed as the capacitor insulating film 51c. The film formation of the capacitor insulating film 51c was executed by using the strontium titanium as a target and then sputtering the target by the gas in which $O_2$ is added to the sputter gas Ar.

Then, the relative dielectric constant $\epsilon$, the leakage current density $J_L$ ($A/cm^2$), and the dielectric breakdown field strength $E_{br}$ (V/cm) of the above capacitor 101c were measured respectively.

The relative dielectric constant $\epsilon$ was 35, and the dielectric breakdown field strength $E_{br}$ was more than 3 MV/cm. Also, the leakage current density $J_L$ was about $10^{-10}$ $A/cm^2$ at the applied voltage of 4 V, which is the very small value that is at the same level as the first example.

As described above, according to the capacitors 101a, 101b, 101c according to the first to third examples, the relative dielectric constant can be enhanced and also reduction in the leakage current and improvement in the dielectric breakdown field strength can be achieved in comparison with the laminated structure that has the flat interface in the prior art.

In this case, in the above first to third examples, both the amorphous dielectric film and the polycrystalline dielectric film were formed of the same dielectric material. But different dielectric materials may be employed.

Second Embodiment

Figure 7:
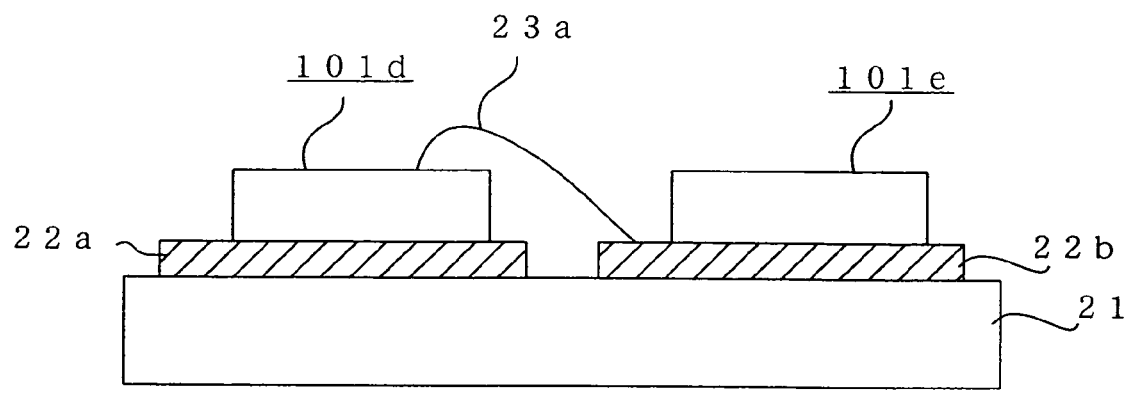
FIG. 7 is a sectional view showing an application 1 of a capacitor according to a second embodiment of the present invention.
Figure 8:
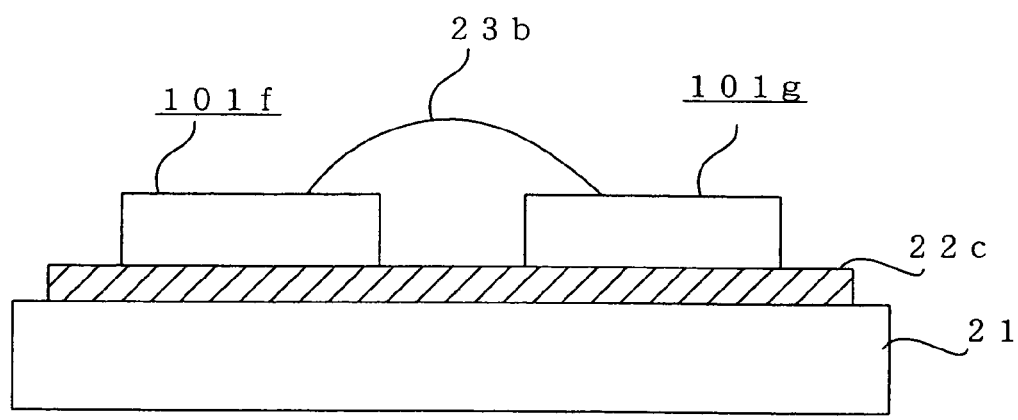
FIG. 8 is a sectional view showing an application 2 of the capacitor according to the second embodiment of the present invention.
Figure 9:
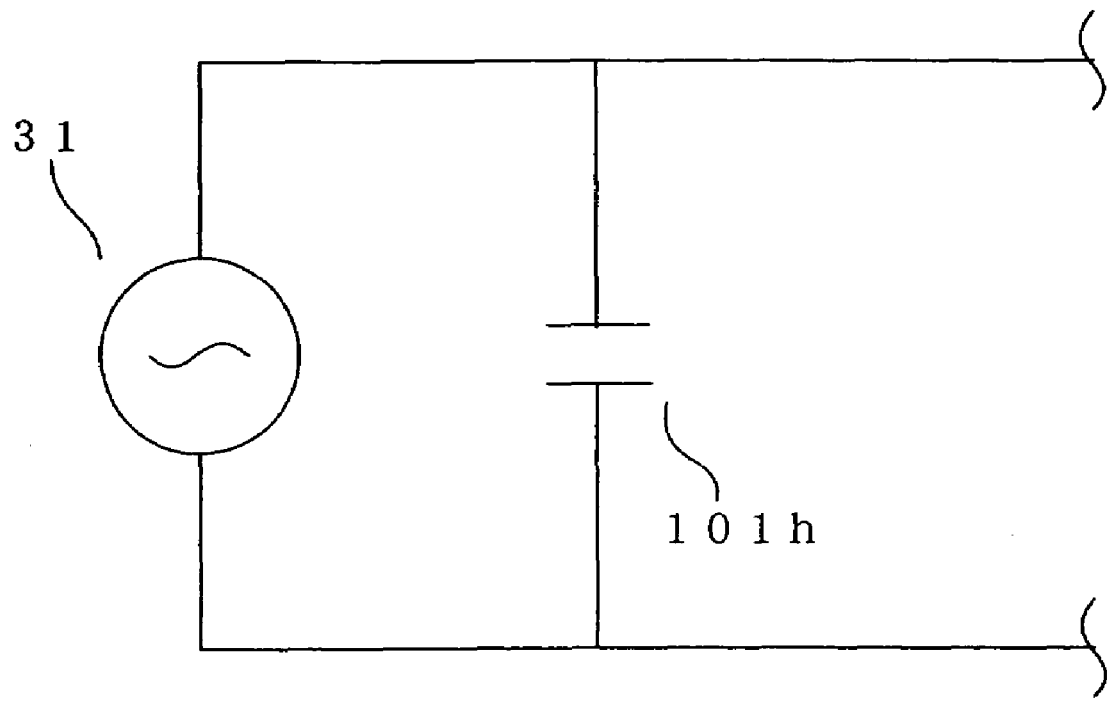
FIG. 9 is a sectional view showing an application 3 of the capacitor according to the second embodiment of the present invention.

Next, applications of a thin film capacitor according to a second embodiment of the present invention will be explained with reference to FIG. 7, FIG. 8, and FIG. 9 hereinafter. FIG. 7, FIG. 8, and FIG. 9 are sectional views showing the application of the thin film capacitor according to the second embodiment respectively.

In FIG. 7, two thin film capacitors 101d, 101e are connected in series. Two thin film capacitors 101d, 101e are put on separate conductive film patterns 22a, 22b, which are isolated electrically, respectively and are fixed thereto by the conductive adhesive. In order to connect two thin film capacitors 101d, 101e in series, an upper electrode of one thin film capacitor 101d are connected via a wire 23a to the conductive film pattern 22b, on which the other thin film capacitor 101e is put and which is connected to a lower electrode of thereof.

In FIG. 8, two thin film capacitors 101f, 101g are connected in parallel. Two thin film capacitors 101f, 101g are put on one conductive film pattern 22c respectively and are fixed thereto by the conductive adhesive. In order to connect two thin film capacitors 101f, 101g in parallel, an upper electrode of one thin film capacitor 101f and an upper electrode of the other thin film capacitor 101g are connected via a wire 23b.

FIG. 9 shows an example in which a capacitor 101h having the same structure as the first embodiment is inserted in parallel with output terminals of a power supply 31 in an AC power supply circuit 102 and is used as the by-pass capacitor. This capacitor 101h has a function of eliminating the high-frequency noises generated from the electronic device, etc. that are connected to the AC power supply circuit 102. This capacitor 101h is installed into the semiconductor integrated circuit in which the AC power supply circuit 102 is integrated.

Also, this capacitor may be employed as the capacitor that is installed into the multi-chip module, or the storage capacitor of DRAM (Dynamic Random Access Memory) and FRAM (Ferroelectric Random Access Memory).

With the above, the present invention is explained particularly with reference to the embodiment. But the present invention is not limited to the examples that are shown in the above embodiments, and variations of the above embodiments within a range that does not depart from the gist of the present invention may be contained in a scope of the present invention.

As described above, according to the thin film capacitor of the present invention, since the capacitor insulating film is constructed by laminating the amorphous dielectric oxide insulating film and the polycrystalline dielectric oxide insulating film via the wave-like interface, the dielectric breakdown voltage is decided by the thick portion of the amorphous dielectric oxide insulating film and also magnitude of the leakage current is decided by the thin portion thereof. Also, the relative dielectric constant is decided in proportion to the effective film thickness of the polycrystalline dielectric oxide insulating film, which is an average film thickness thereof if the wave-like interface would have been flattened on an average. Therefore, in contrast to the laminated structure having the flat interface in the prior art, the effective relative dielectric constant can be increased, and improvement in the breakdown voltage can be achieved, and the small leakage current can be maintained.

Also, according to the method of manufacturing the thin film capacitor of the present invention, the amorphous dielectric oxide insulating film and the polycrystalline dielectric oxide insulating film are formed successively by using the same material under the same film forming conditions. Therefore, the contamination of the layer interface in the laminated structure can be prevented since the laminated structure can be formed by laminating the amorphous film and the polycrystalline film in the same chamber, and also simplification of the production control and reduction in the production cost can be achieved since the same film forming conditions and the same film forming material can be employed.

What is claimed is:

1. A method of manufacturing a thin film capacitor, comprising the steps of:
    (a) forming a first electrode on a substrate via an adhesion enhancing layer;
    (b) forming a capacitor insulating film containing a laminated film, in which an amorphous dielectric film and a polycrystalline dielectric film are laminated via a wave-like interface, by forming sequentially and successively the amorphous dielectric film and the polycrystalline dielectric film made of same material on the first electrode;
    (c) forming a second electrode on the capacitor insulating film; and
    (d) annealing the capacitor insulating film in an oxygen atmosphere.

2. A method of manufacturing a thin film capacitor, according to claim 1, wherein, in the step (b), the amorphous dielectric film and the polycrystalline dielectric film are formed successively while heating the substrate at a constant temperature of less than 450° C.

3. A method of manufacturing a thin film capacitor, according to claim 1, wherein, in the step (b), formation of the laminated film is executed by an RF magnetron sputter method or a DC sputter method.

4. A method of manufacturing a thin film capacitor, according to claim 3, wherein, in the RF magnetron.

* * * * *